United States Patent [19]

Sato

[11] Patent Number: 5,111,161
[45] Date of Patent: May 5, 1992

[54] PLL WITH LOCK DETECTOR FOR DETECTING A SPECIFIED SIGNAL IN A PLURALITY OF INPUT SIGNALS

[75] Inventor: Toshiyuki Sato, Kanagawa, Japan
[73] Assignee: Fujitsu Limited, Kawasaki, Japan
[21] Appl. No.: 669,981
[22] Filed: Mar. 15, 1991
[30] Foreign Application Priority Data Mar. 20, 1990 [JP] Japan .................... 2-72304

[51] Int. Cl.⁵ .............................................. H03L 7/06
[52] U.S. Cl. .................................. 331/25; 331/DIG. 2
[58] Field of Search .................... 331/25, DIG. 2; 375/120; 455/260

[56] References Cited

U.S. PATENT DOCUMENTS 4,787,097 11/1988 Rizzo ........................ 331/11 X

Primary Examiner—Siegfried H. Grimm
Attorney, Agent, or Firm—Staas & Halsey

[57] ABSTRACT

A designated burst signal specified in a designated frequency is detected from an all-inclusive signal specified in a plurality of frequencies, by multiplying a frequency of the all-inclusive signal by a multiplying factor so as to produce a multiplied output signal, performing a phase-lock loop operation between the multiplied output signal and an oscillated signal produced for performing the phase-lock loop operation and specified in a multiplied frequency of the designated frequency by the multiplying factor, so as to produce a phase-lock output signal and comparing the multiplied output signal and the phase-lock output signal for producing a detected output signal representing whether the designated burst signal is in the all-inclusive signal.

4 Claims, 4 Drawing Sheets

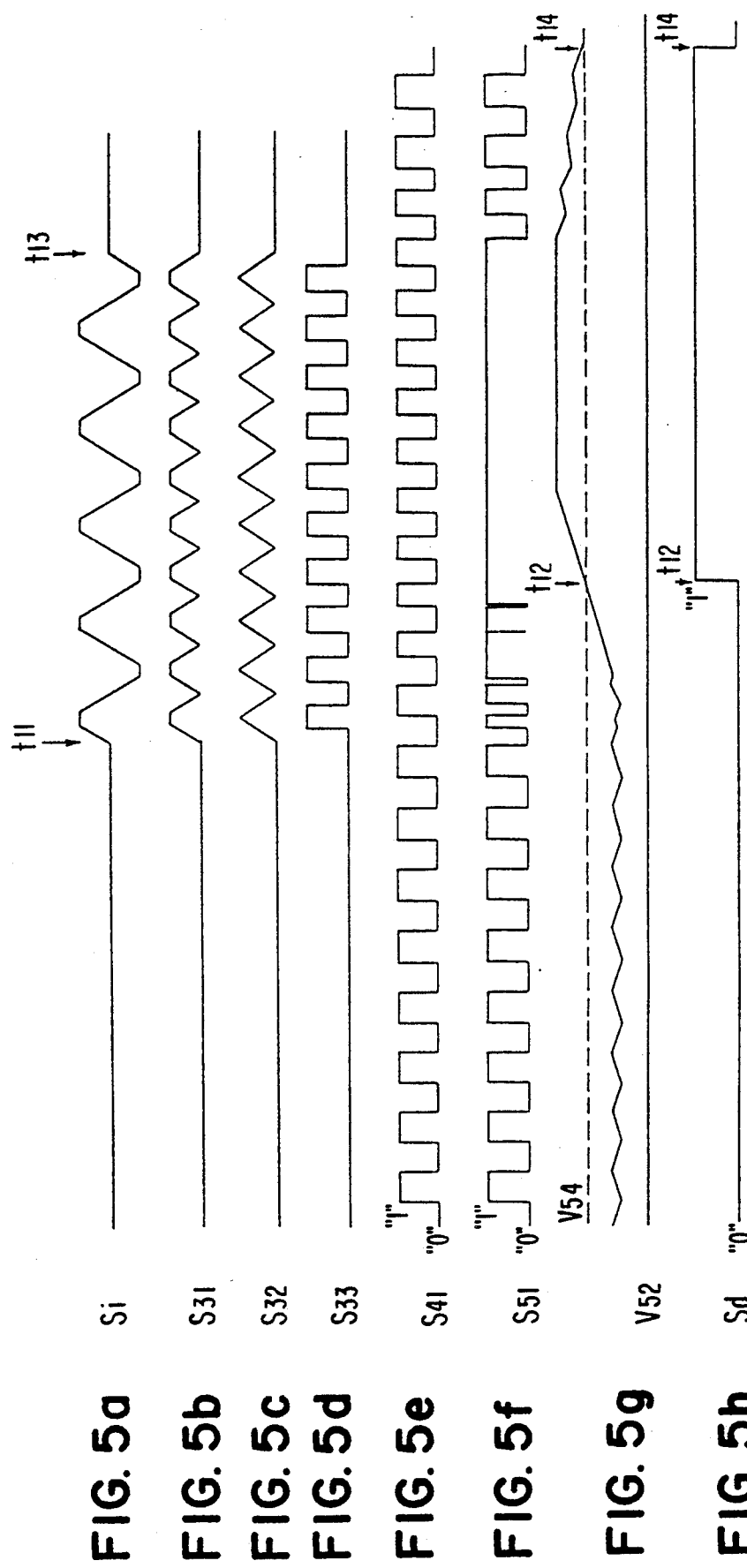

PLL WITH LOCK DETECTOR FOR DETECTING A SPECIFIED SIGNAL IN A PLURALITY OF INPUT SIGNALS

BACKGROUND OF THE INVENTION

1. Field of the Invention

The present invention relates to a signal detecting circuit for detecting a designated signal specified in a designated frequency, from an input signal to the signal detecting circuit, having a plurality of frequency components.

With respect to the above detection, there is an example of a public telephone set in a telephone system. When a calling party speaks with his called party by using a public telephone set through a central office, a metering signal is sent for accounting from the central office to the public telephone set in an accounting cycle. The metering signal is a pulse-shaped burst signal of a sine wave specified in a designated frequency such as 50 Hz, 12 kHz or 16 kHz, and the metering signal is sent to the public telephone set together with a voice signal transmitted between the calling party and the called party. Therefore, the metering signal must be detected from a signal consisting of the voice signal and the metering signal, for accounting at the public telephone set. The same kind of example can be cited from PBX in a telephone system when a subscriber of PBX speaks with his called party accommodated to a central office of the telephone system. That is, a metering signal same as mentioned above is sent to the PBX from the central office for accounting together with a voice signal transmitted between the subscriber and his called party. Therefore, in order to perform the accounting, the metering signal must be detected from a signal consisting of the voice signal and the metering signal at the PBX.

Same as the above examples, in other communication systems or signal processing system, there are many cases that a designated signal specified in a designated frequency component is required to be detected from an input signal having proper frequency components. In order to detect this kind of designated signal, a phase-lock loop circuit has been widely used in the telephone system, called PLL.

2. Description of the Prior Art

FIG. 1 shows an example of a signal detecting circuit (500) of a prior art used in a telephone system, and signals appearing in signal detecting circuit 500 in FIG. 1 are illustrated in FIGS. 2a, 2b, 2c, 2d and 2e respectively.

As well known, signal detecting circuit 500 consists of a Phase-Lock Loop circuit (PLL) 1 and a phase-lock detector 2 and outputs a detection signal $S_d$ (see FIG. 2e) when signal detecting circuit 500 receives an input signal $S_i$ (see FIG. 2a). In FIG. 2a, input signal $S_i$ is depicted in a style of a rectangle-shaped burst wave and the voice signal mentioned before is omitted, for simplicity. This rectangle-shaped burst wave is produced by limiting and waveform shaping the burst sin wave metering signal mentioned before. Means for limiting and waveform shaping the metering signal is not depicted in FIG. 1.

The PLL 1 consists of a Voltage Controlled Oscillator (VCO) 11, a Phase Comparator (PC) 12 and a Low Pass Filter (LPF) 13. The VCO 11 produces a rectangle-shaped oscillation signal $S_{11}$ specified in an oscillation frequency $f_{11}$ proportional to a DC voltage $V_{13}$ output from LPF 13. The PC 12 compares phases of input signal $S_i$ and oscillation signal $S_{11}$ every cycle of $S_{11}$ and produces a rectangle-shaped signal $S_{12}$ in a duty ratio corresponding to a phase difference (lead or lag) between phases of input signal $S_i$ and oscillation signal $S_{11}$ or to a frequency difference between frequencies of $S_i$ and $S_{11}$. And LPF 13 outputs DC voltage $V_{13}$ to VCO 11 by performing low pass filtering to signal $S_{12}$.

When input signal $S_i$ (metering signal) is not given to the signal detecting circuit, the duty ratio of signal $S_{12}$ is kept to 50%, DC voltage $V_{13}$ is kept to a proper value and oscillation frequency $f_{11}$ of signal $S_{11}$ is also kept to a proper frequency so-called free-running frequency ($f_0$). When input signal $S_i$ is given to the signal detecting circuit and a frequency $f_i$ of input signal $S_i$ is higher than oscillation frequency $f_{11}$ or when a phase $\phi_i$ of input signal $S_i$ leads a phase $\phi_{11}$ of signal $S_{11}$, the duty ratio of signal $S_{12}$ becomes larger than 50%, resulting in increasing DC voltage $V_{13}$ and oscillation frequency $f_{11}$. On the contrary, when frequency $f_i$ is lower than frequency $f_{11}$ or when phase $\phi_i$ lags behind phase $\phi_{11}$, the duty ratio of signal $S_{12}$ becomes less than 50%, which results in decreasing DC voltage $V_{13}$ therefore lowering oscillation frequency $f_{11}$.

When frequency $f_i$ is equal to free-running frequency $f_0$, the comparison between the phases (or frequencies) of input signal $S_i$ and signal $S_{11}$ is repeated in PLL 1 until the phase-lock is established between input signal $S_i$ and signal $S_{11}$. When the phase-lock is established, oscillation frequency $f_{11}$ becomes equal to frequency $f_i$ and the phase difference $(\phi_i - \phi_{11})$ between the phases of signals $S_i$ and $S_{11}$ is kept to a fixed value of $\pi$. If free-running frequency $f_0$ or a frequency nearby free-running frequency $f_0$ is not included in input signal $S_i$, frequency $f_{11}$ and phase $\phi_{11}$ of signal $S_{11}$ cannot be locked, establishing no phase-lock.

The phase-lock detector 2 consists of an exclusive OR gate 21, an LPF 22, a voltage comparator 23 and a reference voltage source 24. The exclusive OR gate 21 performs exclusive OR operation to input signals $S_i$ and $S_{11}$ and produces output signal $S_{21}$. The LPF 22 performs low pass filtering to signal $S_{21}$ and produces a DC voltage $V_{22}$. The voltage comparator 23 compares DC voltage $V_{22}$ with a reference voltage $V_{24}$ from reference voltage source 24 and produces detection signal $S_d$ which is equal to the output from the signal detecting circuit 500. The detection signal $S_d$ becomes a signal representing an undetected state such as logic "0" when DC voltage $V_{22}$ is lower than reference voltage $V_{24}$ and becomes a signal representing a detected state such as logic "1" when $V_{22}$ is higher than $V_{24}$.

In FIG. 1 and FIGS. 2a to 2e, since input signal $S_i$ is not given to signal detecting circuit 500 till $t_1$ (see FIG. 2a), VCO 11 oscillates in free-running frequency $f_0$ till $t_1$ as shown in FIG. 2b, so that signal $S_{21}$ becomes a rectangle-shaped signal having 50% duty cycle till $t_1$ as shown in FIG. 2c. In such state, DC voltage $V_{22}$ from LPF 22 is maintained lower than reference voltage $V_{24}$, so that voltage comparator 23 outputs detection signal $S_d$ representing the undetected state (logic "0").

When input signal $S_i$ specified in frequency $f_i$ equal or nearly equal to free-running frequency $f_O$ is given to signal detecting circuit 500 in a time interval from $t_1$ to $t_3$ (see FIG. 2a), VCO 11 operates so as to bring phase $\phi_{11}$ close to phase $\phi_i$ by varying oscillation frequency $f_{11}$ of signal $S_{11}$ around free-running frequency $f_0$, so that the phase difference $(\phi_i - \phi_{11})$ approaches $\pi$ (compare FIGS. 2a and 2b near $t_3$) As the phase difference approaches $\pi$, the duty ratio of output signal $S_{21}$ from exclusive OR gate 21 gradually increases (see a waveform at the time interval from $t_1$ to $t_3$ in FIG. 2c) and DC voltage $V_{22}$ from LPF 22 also rises as shown in FIG. 2d. Then, the phase-lock is established in PLL 1 and the phase difference ($\phi_i - \phi_{11}$) becomes $\pi$. When the duty ratio in signal $S_{21}$ reaches 100%, DC voltage $V_{22}$ becomes reference voltage $V_{24}$ at $t_2$ as shown in FIG. 2d and voltage comparator 23 outputs detection signal $S_d$ representing the detected state (logic "1") as shown in FIG. 2e.

Thus, the free-running state of PLL 1 till $t_1$ is changed to a phase-lock state at $t_2$. In other words, the time interval from $t_1$ to $t_2$ is a transition time for changing the state of PLL 1 from free-running to phase lock. When input signal $S_i$ is ended at $t_3$, PLL 1 starts to bring back the state from phase-lock to free-running by a process opposite to the above, passing through the similar transition time to the above, which is not depicted in FIGS. 2a to 2d.

PROBLEMS IN THE PRIOR ART

However, in the signal detection circuit of the related art, a long transition time is required in PLL 1 to change the free-running state to the phase-lock state and vice versa as shown in FIGS. 2b and 2c, which has been a problem in the prior art. In particular, this problem becomes more remarkable in the telephone system when the metering frequency, which is equal to frequency $f_i$ of input signal $S_i$, is as low as 50 Hz. Because, in some telephone system, such low metering frequency as 50 Hz must be employed in accordance with rules of the telephone system and a time to get the phase-lock is required to be as short as 120 millisecond. From a viewpoint of the reliability of operation, it has been hard to employ such low frequency for the metering frequency as far as the prior art is applied to the telephone system.

SUMMARY OF THE INVENTION

Therefore, an object of the present invention is to shorten a time for detecting a designated signal specified in a designated frequency from a signal having a plurality frequency components, in a signal detecting circuit including a phase-lock loop circuit (PLL).

Another object of the present invention is to increase detecting efficiency of the signal detecting circuit.

Still another object of the present invention is to increase detecting reliability of the signal detection circuit.

The above objects are achieved by providing a frequency multiplier for multiplying the designated frequency, on the passing way of the designated signal given to PLL. The frequency multiplier multiplies the designated frequency by a frequency multiplication factor. Therefore, when the designated signal is given to PLL through the frequency multiplier, the designated frequency is multiplied by the frequency multiplying factor.

As well known, PLL includes an oscillator for producing an oscillation signal specified in a free-running frequency previously determined to be equal to a frequency of a signal to be detected at PLL. When no signal to be detected is given to PLL, the oscillator performs a free-running oscillation, producing the oscillation signal specified in the free-running frequency, so that the signal detecting circuit produces an output representing that a signal to be detected is not detected by the signal detecting circuit. When a signal to be detected is given to PLL with the same frequency as the free-running frequency, phases of the signal to be detected and the oscillation signal are compared and the phase of the oscillation signal is varied until both phases are coincided to each other. When the phases are coincided to each other, which is called "phase-lock", the signal detecting circuit outputs a signal representing that the signal to be detected is detected by the signal detecting circuit.

In the process of achieving the phase-lock, it takes a time (transit time) to change the state of PLL from free-running to phase-lock after the signal to be detected is given to PLL, and similarly to the above, it takes another transit time to change the state of PLL from phase-lock to free-running after the signal to be detected disappears. However, precisely considering the transit time, there is a fact that the transit time is inversely proportional to the frequency of the signal to be detected or the free-running frequency. This is a point of the present invention. That is, in the present invention, because of increasing the frequency of the input designated signal by multiplying the frequency at the frequency multiplier, the transit time can be shortened when the free-running frequency in PLL is also increased same as the multiplied frequency of the input designated signal. As a result of shortening the transit time thus, the time for detecting the designated signal can be shortened, so that the detecting efficiency and reliability of the signal detecting circuit can be increased.

BRIEF DESCRIPTION OF THE DRAWINGS

FIG. 5a is a waveform illustrated for an input signal to a frequency multiplier in the signal detecting circuit;

FIG. 5b is a waveform illustrated for an output signal from a diode bridge in the frequency multiplier;

FIG. 5c is a waveform illustrated for an output signal from a low pass filter in the frequency multiplier;

FIG. 5d is a waveform illustrated for an output signal from a waveform shaper in the frequency multiplier;

FIG. 5e is a waveform illustrated for an output signal from a voltage controlled oscillator in a phase-lock loop circuit of the signal detecting circuit;

FIG. 5f is a waveform illustrated for an output signal from an exclusive OR gate in a phase-lock detector of the signal detecting circuit;

FIG. 5g is an illustration of an output signal from an low pass filter in the phase-lock detector; and FIG. 5h is an illustration of an output signal from a voltage comparator in the phase-lock detector.

DESCRIPTION OF THE PREFERRED EMBODIMENT

Figure 3:
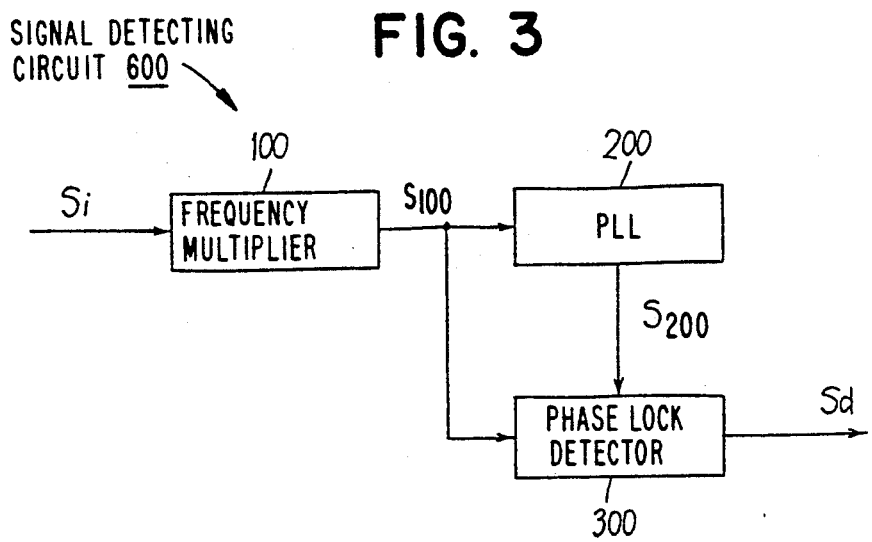
FIG. 3 is a block diagram for illustrating a principle of a signal detecting circuit embodying the present invention.
Figures 2A, 2B, 2C, 2D, 2E:
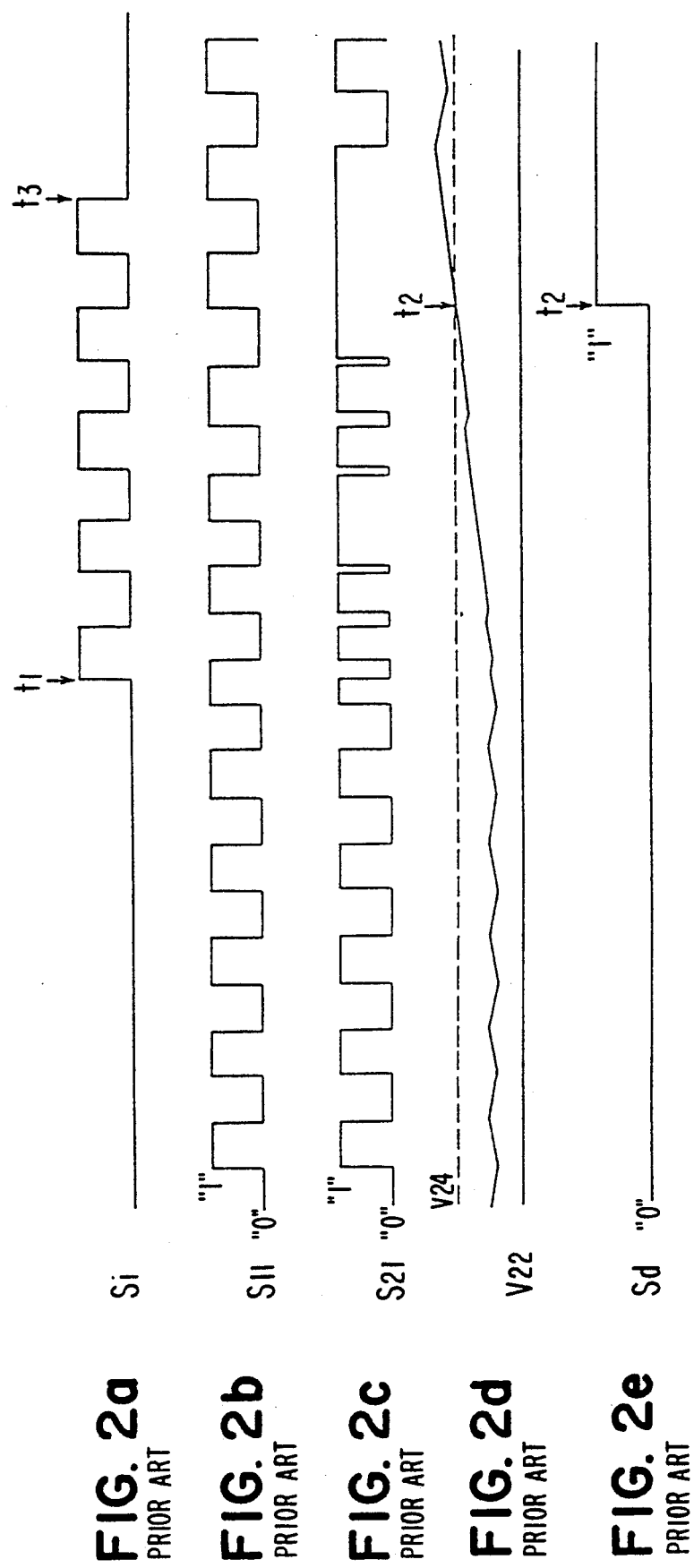
FIG. 2a is a waveform illustrated for an input signal to a signal detecting circuit.
FIG. 2b is a waveform illustrated for an output from a voltage controlled oscillator (VCO) in a phase-lock loop circuit (PLL) of the prior art signal detecting circuit.
FIG. 2c is a waveform illustrated for an output signal from an exclusive OR gate in a phase-lock detector of the prior art signal detecting circuit.
FIG. 2d is a DC voltage illustrated for an output signal from a low pass filter in the phase-lock detector.
FIG. 2e is an illustration of an output signal from a voltage comparator in the phase-lock detector.

FIG. 3 illustrates a principle of a signal detecting circuit 600 embodying the present invention. In FIG. 3, signal detecting circuit 600 consists of a frequency multiplier 100, a PLL 200 and a phase-lock detector 300. The frequency multiplier 100 is a circuit newly provided in signal detecting circuit 600 for the present invention and PLL 200 and phase-lock detector 300 are functionally same as PLL 1 and phase-lock detector 2 in signal detecting circuit 500 of the prior art respectively. The frequency multiplier 100 multiplies a frequency $f_i$ of input signal $S_i$ to signal detecting circuit 600 by a multiplying factor N, producing output signal $S_{100}$. The PLL 200 performs phase-lock so that a free-running oscillation signal in PLL 200 is locked in a designated signal specified in a designated frequency in signal $S_{100}$ received from frequency multiplier 100, producing an output signal $S_{200}$. The phase-lock detector 300 compares signal $S_{100}$ with signal $S_{200}$ for detecting whether these signals are in a phase-lock state with each other and produces detection signal $S_d$. The detection signal $S_d$ becomes the signal representing the detected state if there is a signal specified in a frequency being one Nth of multiplied frequency in input signal $S_i$.

Since the multiplied frequency is used, phase-lock becomes possible in PLL 200 even though the time interval of the pulse-shaped input signal $S_i$ is short, which greatly increases the detecting ability of the metering signal and therefore increases a processing speed of the telephone system.

Figure 4:
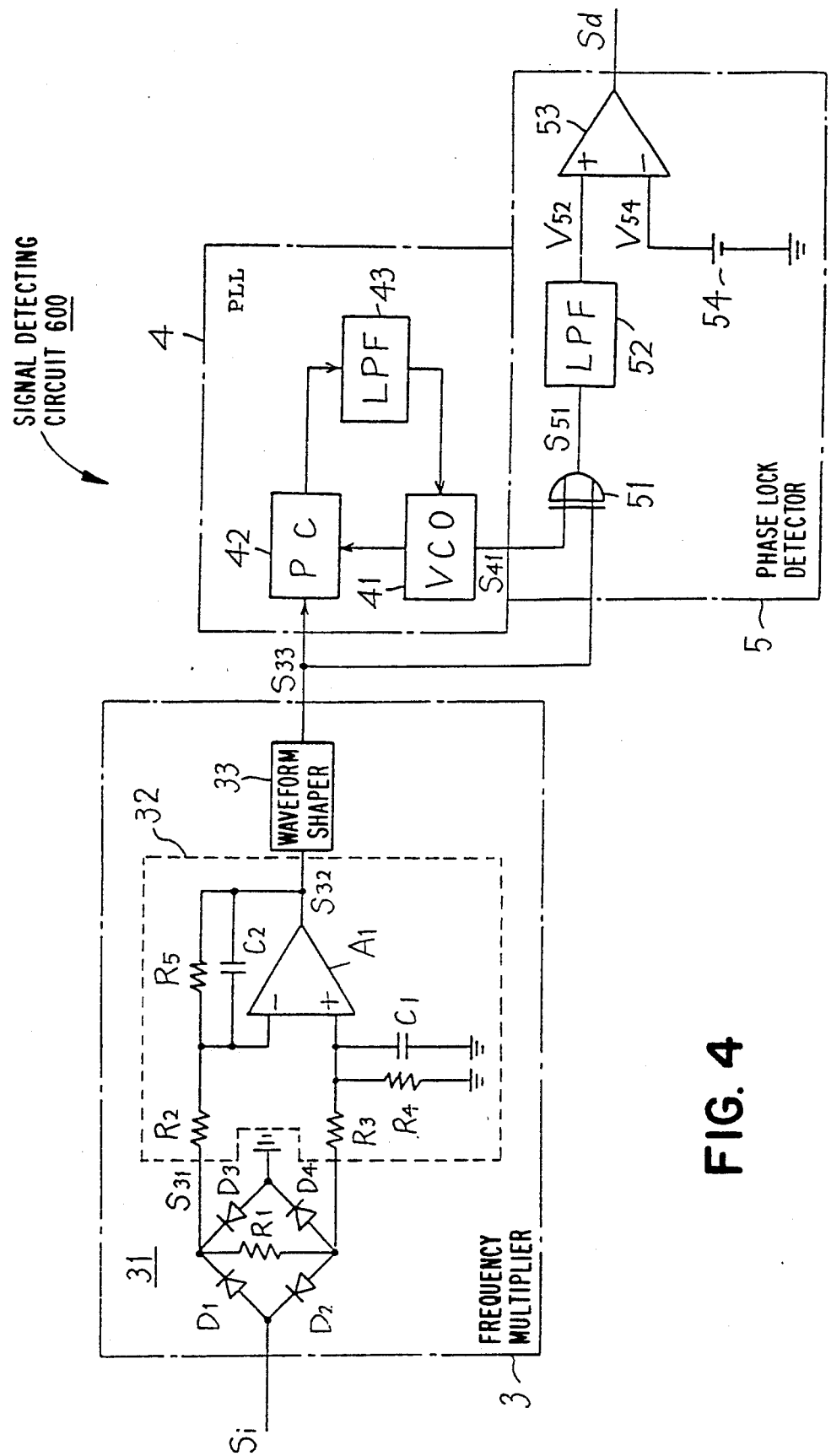
FIG. 4 is a block diagram of a signal detecting circuit embodying the present invention.

A preferred embodiment of the present invention will be explained in reference to FIG. 4 and FIGS. 5a to 5h below. FIG. 4 shows a schematic diagram of signal detecting circuit 600 embodying the present invention and FIGS. 5a to 5h illustrate the waveforms of signals appearing in the schematic diagram shown in FIG. 4. In FIG. 4 and 5a to 5h, the same reference numeral or symbol as in FIGS. 1 and 2a to 2e designates the same part, circuit or signal as in FIGS. 1 and 2a to 2e.

The signal detecting circuit 600 consists of a frequency multiplier 3, a PLL 4 and a phase-lock detector 5 as shown in FIG. 4. In FIG. 4, frequency multiplier 3, PLL 4 and phase-lock detector 5 are provided as frequency multiplier 100, PLL 200 and phase-lock detector 300 in FIG. 3 respectively. The frequency multiplier 3 is provided so as to operate under a condition that N = 2 in this embodiment, so that frequency multiplier 3 consists of a diode bridge 31 including four diodes $D_1$, $D_2$, $D_3$ and $D_4$ and additional circuits such as: an LPF 32 consisting of an operational amplifier $A_1$, resistors $R_2$, $R_3$, $R_4$ and $R_5$ and capacitors $C_1$ and $C_2$; and a waveform shaper 33. The diode bridge 31 produces an output signal $S_{31}$ specified in a doubled frequency of frequency $f_i$ of input signal $S_i$ by performing fullwave rectification to input signal $S_i$. The LPF 32 produces an output signal $S_{32}$ by extracting a base frequency component being a doubled frequency component of input signal frequency $f_i$. The waveform shaper 33 produces output signal $S_{33}$ formed to a pulse-shaped wave by shaping signal $S_{32}$. Therefore, waveform shaper 33 produces output signal $S_{33}$ formed to a rectangle-shaped wave specified in a doubled frequency of frequency $f_i$ of input signal $S_i$.

Figure 1:
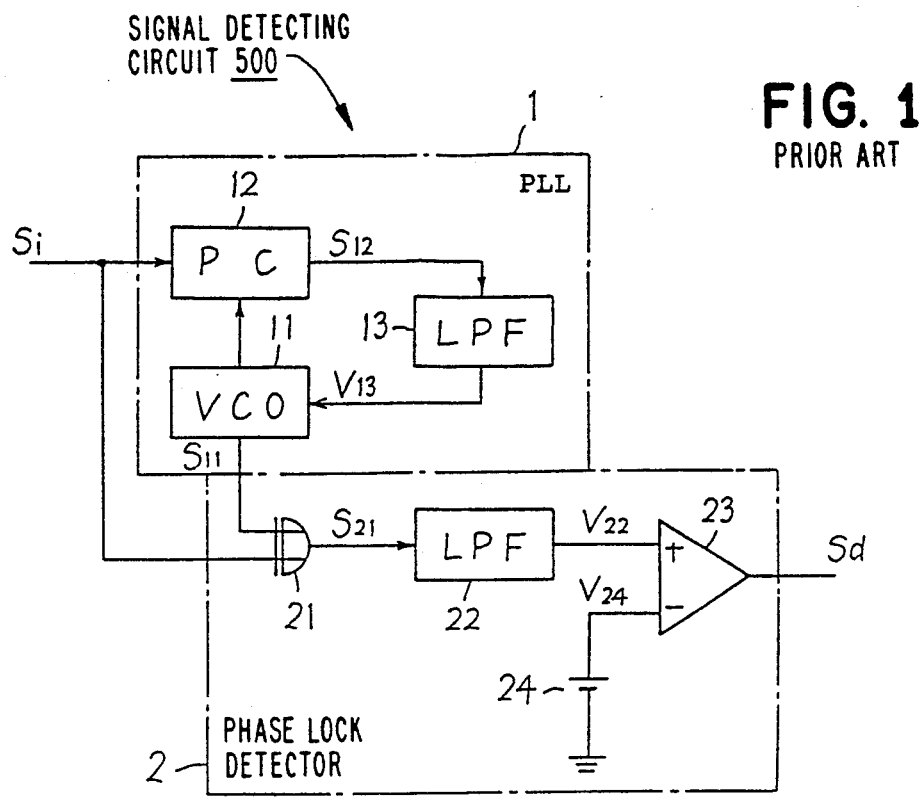
FIG. 1 is a block diagram of a signal detecting circuit of the prior art.

The PLL 4 consists of VCO 41, PC 42 and LPF 43 each having the same function as VCO 11, PC 12 and LPF 13 in PLL 1 in FIG. 1 respectively. That is, the VCO 11 has a free-running frequency $f_{40}$ equal or nearly equal to a doubled frequency $f_{33}$ of a designated signal (metering signal) included in input signal $S_i$. As a result, when signal $S_{33}$ from frequency multiplier 3 includes a signal specified in the doubled frequency $f_{33}$, PLL 4 performs the phase-lock between the doubled frequency $f_{33}$ and a oscillation frequency of VCO 41 and produces output signal $S_{41}$ having a phase different from a phase of the designated signal as much as $\pi$. A phase lock detector 5 in FIG. 4 consists of an exclusive OR gate 51, an LPF 52, voltage comparator 53 and a reference voltage source 54 and detects that PLL 4 is in the phase-lock state with the designated signal in signal $S_{33}$, same as phase lock detector 2 in FIG. 1.

The above operation of signal detecting circuit 600 will be further explained in reference to FIGS. 5a to 5h. FIG. 5a shows a waveform of input signal $S_i$. However, in FIG. 5a, only a designated signal such as a metering signal is depicted in a style of burst signal appearing in a time interval between $t_{11}$ and $t_{13}$, omitting other signals such as a voice signal for simplicity. When the designated signal is given to diode bridge circuit 31 as shown in FIG. 5a, diode bridge circuit 31 performs full-wave rectification, producing signal $S_{31}$ as shown in FIG. 5b. The LPF 32 extracts a doubled frequency component of the designated signal so as to produce signal $S_{32}$ as shown in FIG. 5c. Then waveform shaper 33 shapes signal $S_{32}$ so as to produce signal $S_{33}$ having a square-shaped wave as shown in FIG. 5d. Since no signal is given to PLL 4 till $t_{11}$ as shown in FIG. 5d, VCO 41 oscillates signal $S_{41}$ specified in a free-running frequency $f_0$ in 50% duty ratio till t as shown in FIG. 5e. In such state, exclusive OR gate 51 outputs signal $S_{51}$ in 50% duty ratio till $t_{11}$ as shown in FIG. 5f, and output voltage $V_{52}$ from LPF 52 is maintained at a voltage lower than reference voltage $V_{54}$ as shown in FIG. 5g, so that voltage comparator 53 produces detection signal $S_d$ representing an undetected state (logic "0") as shown in FIG. 5d.

When $t_{11}$ passes, the phase of the signal $S_{41}$ specified in the free-running frequency $f_0$ varies so as to lock to the phase of signal $S_{33}$ in PLL 4, taking a transit time (from $t_{11}$ to $t_{12}$) as seen from comparison between FIGS. 5e and 5f in an interval from $t_{11}$ to $t_{12}$. That is, during the transit time, PLL 4 compares phase $\phi_{33}$ of signal $S_{33}$ with phase $\phi_{41}$ of signal $S_{41}$ and varies the phase $\phi_{33}$ so that the phase difference ($\phi_{33} - \phi_{41}$) becomes $\pi$ by making phase $\phi_{33}$ follow phase $\phi_{41}$.

In phase lock detector 5, as the phase difference ($\phi_{33} - \phi_{41}$) closes to $\pi$, the duty ratio of signal $S_{51}$ from exclusive OR gate 51 increases gradually and therefore output voltage $V_{52}$ from LPF 52 increases. When the phase difference becomes $\pi$, the duty ratio of signal $S_{51}$ reaches 100% as shown in FIG. 5f and output voltage $V_{52}$ exceeds reference voltage $V_{54}$ at $t_{12}$ as shown in FIG. 5g, so that voltage comparator 53 produces detection signal $S_d$ presenting the detected state (logic "1") and the detected state continues as far as $V_{52}$ exceeds reference voltage $V_{52}$ as shown in FIG. 5h.

When the burst input signal $S_i$ is over at $t_{13}$, PLL 4 is brought back to the free-running state at $t_{14}$ in a opposite process to the above phase-lock process through a transition time from $t_{13}$ to $t_{14}$ as shown after $t_{13}$ in FIGS. 5f, 5g and 5h.

As seen from the above explanation of the embodiment, since frequency multiplier 3 doubles the frequency $f_i$ of input signal $S_i$ and the phase-lock is performed by using the oscillation signal specified in the doubled frequency in PLL 4, the transit time (from $t_{11}$ to $t_{12}$) for establishing the phase-lock state on PLL 4 and the transit time (from $t_{13}$ to $t_{14}$) for bringing PLL 4 back to the free-running state can be shortened to as little as one half of that in the prior art. As a result, the signal detection can be performed, leaving a sufficient margin though the signal to be detected is given to the signal detecting circuit 600 in a short time.

In the above explanation of the embodiment, the detection of the metering signal in the telephone system has been discussed. However, the present invention is not limited to apply the telephone system. The present invention can be applied to other communication system or signal processing systems. The block diagram shown in FIG. 4 is an embodiment of the present invention. Other circuits can be considered to achieve the object of the present invention. In the explanation of the embodiment in reference to FIG. 4 and FIGS. 5a to 5h, the multiplying factor N is set to two in frequency multiplier 3, however, another number larger than two is applicable to N. The constitution of frequency multiplier 100, PLL 200 and phase lock detector 300 in FIG. 3 is concretely shown in frequency multiplier 3, PLL 4 and phase lock detector 5 in FIG. 4 respectively, however, the constitution in FIG. 3 is not limited to that in FIG. 4.

What is claimed is:

1. A signal detecting circuit for detecting a designated signal specified in a designated frequency, from an input signal, specified in a plurality of frequencies, applied to the signal detecting circuit, said signal detecting circuit comprising:
    a frequency multiplier for multiplying an input frequency, which is one of the plurality of frequencies, of the input signal, said frequency multiplier having a multiplying factor and producing a multiplier output signal specified in a frequency obtained by multiplying the input frequency by the multiplying factor;
    a phase-lock loop circuit for performing phase-lock between a phase of the multiplier output signal and a phase of an oscillation signal produced in said phase-lock loop circuit and producing a phase-lock output signal, said oscillation signal being specified in a multiplied frequency of the designated frequency by the multiplying factor and said phase-lock being performed by comparing phases of the multiplier output signal and the oscillation signal, producing a comparison result and shifting the phase of the oscillation signal in response to the comparison result so that the phases of the multiplier output signal and the oscillation signal are synchronized with each other; and
    a phase-lock detector for producing a detected output signal of the signal detecting circuit for representing whether the designated signal is in the input signal, by comparing the multiplier output signal with said oscillation signal.

2. A signal detecting circuit according to claim 1, wherein said frequency multiplier comprises a diode bridge circuit performing fullwave rectification of the input signal for producing a multiplier output signal specified in a doubled frequency of the input frequency.

3. A signal detecting circuit according to claim 2, wherein said frequency multiplier further comprises:
    a low pass filter for extracting a filter output signal specified in the doubled frequency, from the multiplier output signal specified in the doubled frequency; and
    a waveform shaper for shaping a waveform of the filter output signal into a rectangle-shaped wave.

4. A signal detecting method for detecting a designated signal specified in a designated frequency from an all-inclusive signal to be examined, specified in a plurality of frequencies; said method comprising the steps of:
    multiplying a frequency of the all-inclusive signal by a multiplying factor, producing a multiplied signal specified in a multiplied frequency of the frequency of the all-inclusive signal by the multiplying factor;
    comparing a phase (first phase) of the multiplied signal with a phase (second phase) of an oscillated signal specified in a multiplied frequency of the designated frequency by the multiplying factor, producing a comparison output signal;
    shifting the second phase in response to the comparison output signal so that the first phase is locked with the second phase;
    repeating said steps of phase comparison and phase shift until phase-lock between the first and second phases is established and producing a phase-lock output signal; and
    comparing the phase-lock output signal with the multiplied signal for producing a detected output signal representing whether the designated signal is in the all-inclusive signal.

* * * * *

UNITED STATES PATENT AND TRADEMARK OFFICE
CERTIFICATE OF CORRECTION

PATENT NO. : 5,111,161
DATED : May 5, 1992
INVENTOR(S) : Toshiyuki SATO

It is certified that error appears in the above-identified patent and that said Letters Patent is hereby corrected as shown below:

Column 1, line 59, change "sin" to --sine--.

Column 4, line 10, delete "the"

(second occurrence only).

Column 4, line 67, change "an" (2nd occurrence) to --a--.

Column 6, line 8, change "a" to --an--.

Column 6, line 33, change "t" to --$t_{11}$--.

Column 6, line 62, change "a" to --an--.

Signed and Sealed this

Fourteenth Day of September, 1993

Attest:

BRUCE LEHMAN

Attesting Officer    Commissioner of Patents and Trademarks